United States Patent
Naik et al.

(10) Patent No.: US 7,193,460 B1
(45) Date of Patent: Mar. 20, 2007

(54) CIRCUIT FOR CONTROLLING POWER AMPLIFIER QUIESCENT CURRENT

(75) Inventors: Amish Naik, Los Angeles, CA (US); Andre Metzger, La Jolla, CA (US); Thomas L. Fowler, Moorpark, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 11/390,576

(22) Filed: Mar. 27, 2006

Related U.S. Application Data

(63) Continuation of application No. 10/915,279, filed on Aug. 10, 2004, now Pat. No. 7,046,087.

(51) Int. Cl.
*H03G 3/20* (2006.01)

(52) U.S. Cl. .................. 330/136; 330/296; 330/285

(58) Field of Classification Search ............. 330/136, 330/296, 285
See application file for complete search history.

(56) References Cited

U.S. PATENT DOCUMENTS

| | | | |
|---|---|---|---|
| 6,233,440 B1 * | 5/2001 | Taylor | 455/127.2 |
| 6,304,145 B1 * | 10/2001 | Laureanti et al. | 330/285 |
| 6,427,067 B1 * | 7/2002 | Arentz | 455/232.1 |
| 6,515,545 B1 * | 2/2003 | Hu et al. | 330/295 |
| 6,791,418 B2 * | 9/2004 | Luo et al. | 330/296 |
| 7,005,923 B2 * | 2/2006 | Noh et al. | 330/285 |

\* cited by examiner

*Primary Examiner*—Patricia Nguyen
(74) *Attorney, Agent, or Firm*—Farjami & Farjami LLP

(57) ABSTRACT

According to one exemplary embodiment, a circuit arrangement includes a power amplifier configured to receive an RF input signal. The circuit arrangement further includes a control circuit configured to receive and convert the RF input signal to an output DC voltage. The control circuit includes a voltage amplifier coupled to a peak detector circuit, where the peak detector circuit outputs the output DC voltage. The circuit arrangement further includes an analog control bias circuit coupling the output DC voltage to a bias input of the power amplifier. The output DC voltage causes the power amplifier to have a quiescent current that increases in a way that is substantially logarithmic with respect to the amplitude of the RF input signal. An increase in the RF input power can cause a substantially linear increase in the output DC voltage, where the RF input power is measured in dBm.

6 Claims, 2 Drawing Sheets

CIRCUIT FOR CONTROLLING POWER AMPLIFIER QUIESCENT CURRENT

This is a continuation of application Ser. No. 10/915,279 filed Aug. 10, 2004 now U.S. Pat. No. 7,046,087.

BACKGROUND OF THE INVENTION

1. Field of the Invention

The present invention is generally in the field of semiconductor devices. More specifically, the invention is in the field of semiconductor amplifiers.

2. Related Art

Power amplifiers, such as power amplifiers used in cellular handsets as well as other wireless communication devices, are typically designed and biased for optimum quiescent current in order to meet high output power specifications. However, the same quiescent current that is optimal for high power levels is not optimal at low power levels. By way of background, quiescent current refers to the current drawn by an amplifier when the amplifier is not receiving an input signal. Excessive quiescent current in power amplifiers at low output power levels causes an undesirable increase in power consumption, which can reduce battery life in portable communication devices, such as cellular handsets.

Conventional techniques to reduce quiescent current in power amplifiers at low output power levels have employed an external control pin, which can be either digital or analog. A digital control pin has a low mode and a high mode to switch from low to high quiescent current, while an analog control pin requires a continuous input voltage to control the amount of quiescent current supplied to the power amplifier for a specified power output.

However, during the switch from low to high quiescent current and vice versa, a digital control pin can introduce undesirable gain, phase, and power discontinuities in the power amplifier. Furthermore, a digital switch also requires baseband circuitry to switch the power amplifier from low mode to high mode when the power amplifier reaches saturation in low mode. On the other hand, conventional techniques that employ an analog control pin require more complex baseband circuitry and time-consuming testing and calibration procedures.

Thus, there is a need in the art for an effective means for reducing quiescent current at low power output levels in a power amplifier, such as a power amplifier used in a cellular handset.

SUMMARY OF THE INVENTION

The present invention is directed to quiescent current control circuit for power amplifiers. The present invention addresses and resolves the need in the art for an effective means for reducing quiescent current at low power output levels in a power amplifier, such as a power amplifier used in a cellular handset.

According to one exemplary embodiment, a circuit arrangement includes a power amplifier configured to receive an RF input signal. The power amplifier can be a linear power amplifier. The circuit arrangement further includes a control circuit configured to receive and convert the RF input signal to an output DC voltage. The control circuit can include a voltage amplifier coupled to a peak detector circuit, where the peak detector circuit outputs the output DC voltage. The voltage amplifier can be configured to receive the RF input signal and provide an output signal, where an increase in amplitude of the RF input signal causes a substantially logarithmic increase in an amplitude of the output signal. The voltage amplifier may be, for example, a GaAs HBT and can be configured to operate as a Class AB voltage amplifier. The peak detector circuit can be configured to convert an output of the voltage amplifier to the output DC voltage, where the output DC voltage increases in a way that is substantially logarithmic with respect to the amplitude of the RF input signal.

According to this exemplary embodiment, the circuit arrangement further includes an analog control bias circuit coupling the output DC voltage to a bias input of the power amplifier. The analog control bias circuit can be configured to receive the output DC voltage and provide a bias voltage or current to the bias input of the power amplifier, where the bias current is linearly proportional to the output DC voltage. The output DC voltage causes the power amplifier to have a quiescent current that increases in a way that is substantially logarithmic with respect to the amplitude of the RF input signal. An increase in the RF input power can cause a substantially linear increase in the output DC voltage, as compared to the RF input power measured in dBm. Other features and advantages of the present invention will become more readily apparent to those of ordinary skill in the art after reviewing the following detailed description and accompanying drawings.

DETAILED DESCRIPTION OF THE INVENTION

The present invention is directed to a quiescent current control circuit for power amplifiers. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

By way of background, for a given output power level of a power amplifier, there is a minimum amount of quiescent current that is required to achieve output linearity. Experimental data was collected using a standard two-stage power amplifier and increasing the reference voltage to cause the quiescent current to increase from 20.0 mA to 55.0 mA. For each of a selected number of quiescent currents in the 20.0 mA to 55.0 mA range, RF input power was applied and increased until the power amplifier became non-linear (failing typical power amplifier linearity specifications). For each selected quiescent current, the corresponding RF input power level where the power amplifier would become non-linear was recorded. As a result, a curve showing minimum quiescent current as a function of RF input power of a power amplifier was plotted. The current also showed optimal quiescent current as a function of RF output power, since minimum quiescent current required to achieve a linear power amplifier output is also considered an optimal quiescent current.

The above curve was an approximate straight line, which indicates that quiescent current must optimally increase as a linear function of RF input power as measured in dBm or as a logarithmic function of RF input power as measured in milliwatts. As will be discussed in detail below, the present invention's quiescent current control circuit was designed to cause a power amplifier to have a quiescent current that varies, i.e. increases and decreases, as a substantially logarithmic function of RF input power (in milliwatts) or as a substantially linear function of RF input power (in dBm).

Figure 1:
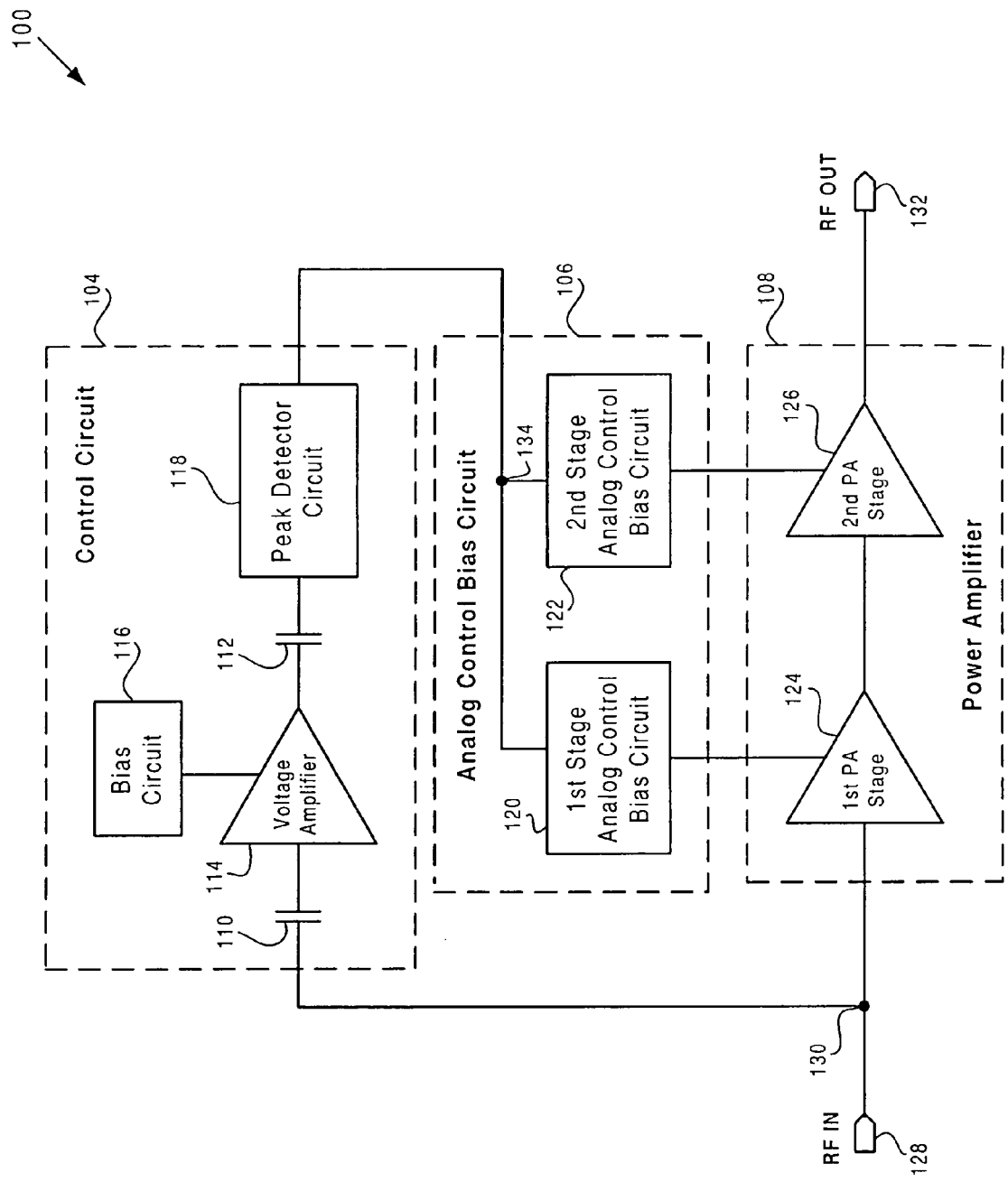
FIG. 1 is a block diagram of an exemplary quiescent current control circuit coupled to an exemplary power amplifier in accordance with one embodiment of the present invention.

FIG. 1 shows a block diagram of an exemplary circuit arrangement including an exemplary quiescent current control circuit, an exemplary power amplifier bias circuit, and an exemplary power amplifier in accordance with one embodiment of the present invention. Certain details and features have been left out of FIG. 1, which are apparent to a person of ordinary skill in the art. Circuit arrangement 100 includes quiescent current control circuit 104, which is referred to as "control circuit 104" in the present application to preserve brevity, analog control bias circuit 106, and power amplifier 108. Control circuit 104 includes capacitors 110 and 112, voltage amplifier 114, bias circuit 116, and peak detector circuit 118. Analog control bias circuit 106 includes first stage analog control bias circuit ("first stage bias circuit") 120 and second stage analog control bias circuit ("second stage bias circuit") 122 and power amplifier 108 includes first power amplifier stage 124 and second power amplifier stage 126.

Circuit arrangement 100 can be used in wireless communication devices, such as cellular handsets using, for example, code-division multiple access ("CDMA") wireless communication standard. In the present embodiment, circuit arrangement 100, with the exception of a large filter capacitor (not shown in FIG. 1) used in control circuit 104, can be fabricated on a single semiconductor die using gallium arsenide ("GaAs") technology. In other embodiments, circuit arrangement 100 may be fabricated using silicon germanium ("SiGe") technology or other appropriate technologies.

As shown in FIG. 1, RF input signal ("RF IN") 128 is coupled to the RF input of power amplifier 108 at node 130. Power amplifier 108 includes first power amplifier stage 124 coupled to second power amplifier stage 126 and can be configured to receive and amplify RF IN 128 and generate RF output signal ("RF OUT") 132. By way of example, power amplifier 108 may be a power amplifier for wireless communication device, such as a cellular handset. Also shown in FIG. 1, the input of voltage amplifier 114 is coupled to node 130 by capacitor 110 and the output of voltage amplifier 114 is coupled to the input of peak detector circuit 118 by capacitor 112. Capacitor 110 prevents DC current from flowing between node 130 and the input of voltage amplifier 114 and might have a value of, for example, 8.0 picofarads ("pF"). Capacitor 112 couples the output of voltage amplifier 114 to the input of peak detector circuit 118 and might have a value of 1.0 pF, for example.

Voltage amplifier 114 can be configured to receive a low-level sample of RF IN 128 and amplify the low-level sample of RF IN 128 to a detectable level. Voltage amplifier 114 can also be configured to operate as a Class AB amplifier such that peak detector circuit 118 can provide a DC output voltage that is a substantially logarithmic function of input voltage. By configuring voltage amplifier 114 as discussed above, the present invention achieves advantages that will be discussed below. Further shown in FIG. 1, bias circuit 116 is coupled to voltage amplifier 114 and can be configured to cause bias voltage amplifier 114 to operate in a Class AB operating mode.

Also shown in FIG. 1, the output of peak detector circuit 118 is coupled to the inputs of first stage bias circuit 120 and second stage bias circuit 122 at node 134, which is also the input of analog control bias circuit 106. Peak detector circuit 118 can be configured to convert the amplified sample of RF IN 128 received at the output of voltage amplifier 114 into a DC voltage that increases and decreases in a way that is substantially logarithmic with respect to the amplitude of RF IN 128. Peak detector circuit 118 can be further configured to sufficiently shift the voltage range of the DC voltage such that the DC voltage, when inputted into analog control bias circuit 106, causes power amplifier 108 to have a quiescent current that is a substantially linear function of RF input power (in dBm) at the RF input of power amplifier 108.

Also shown in FIG. 1, the outputs of first stage bias circuits 120 and 122 of analog control bias circuit 106 are coupled to respective bias inputs of first and second power amplifier stages 124 and 126 of power amplifier 108. First and second stage bias circuits 120 and 122 can be configured to receive a DC voltage outputted by peak detector circuit 118 of control circuit 104 and appropriately adjust the quiescent current of respective first and second power amplifier stages 124 and 126 according to the DC voltage. First and second stage bias circuits 120 and 122 are substantially similar to each other and can also be configured to provide a bias voltage or current to respective first and second power amplifier stages 124 and 126 that varies linearly with respect to a DC voltage inputted into first and second stage bias circuits 120 and 122.

Thus, by utilizing control circuit 104 to receive a sample of RF IN 128 and output a DC voltage that is a substantially logarithmic function of RF input power (in milliwatts) at the RF input of voltage amplifier 114, the present invention advantageously achieves a power amplifier having an optimal quiescent current that is automatically adjusted as a function of RF input power.

Figure 2:
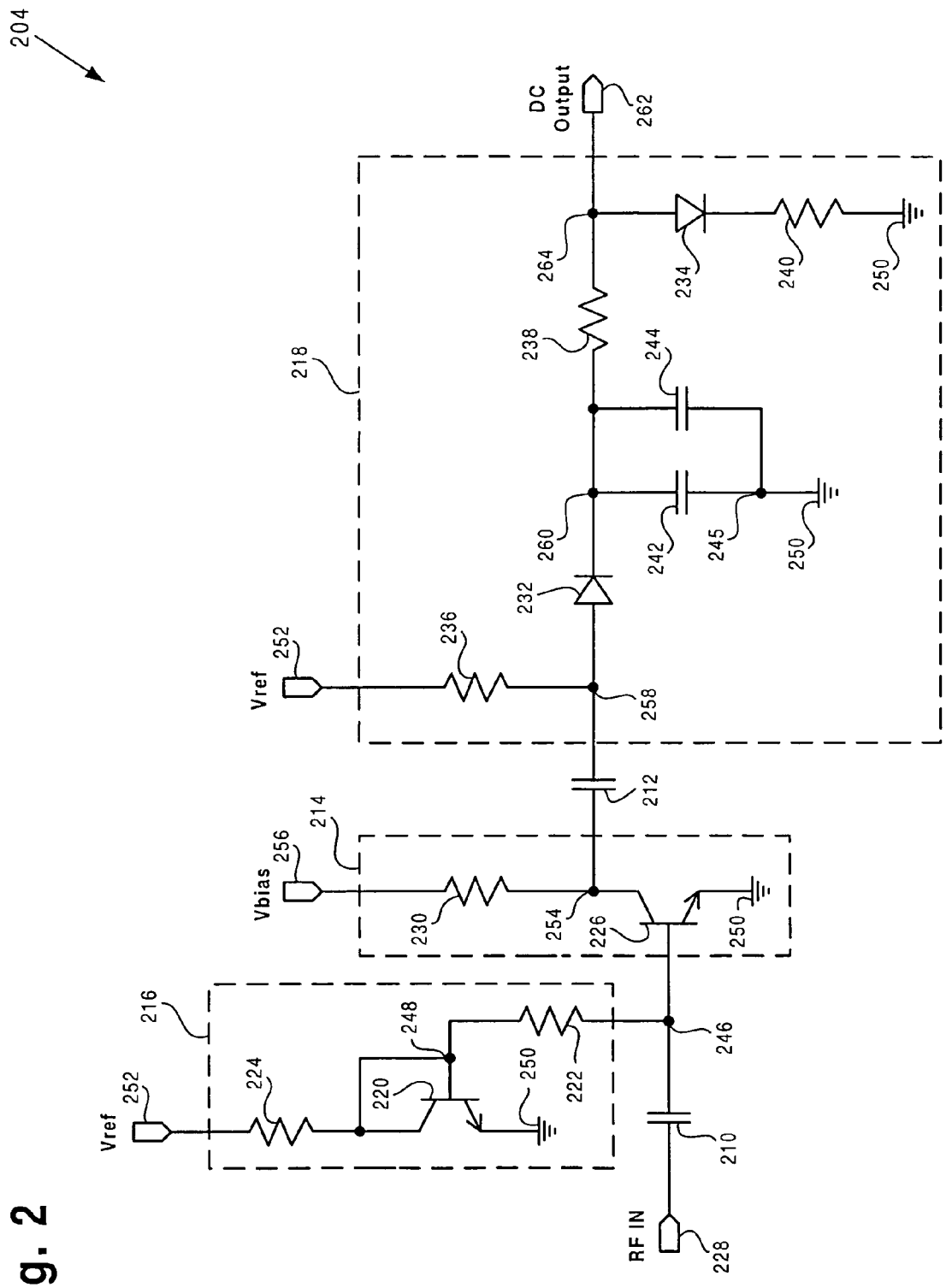
FIG. 2 illustrates a circuit diagram of an exemplary quiescent current control circuit in accordance with one embodiment of the present invention.

FIG. 2 shows a schematic diagram of control circuit 204 in accordance with one embodiment of the present invention. Control circuit 204 in FIG. 2 corresponds to control circuit 104 in FIG. 1. In particular, capacitors 210 and 212, voltage amplifier 214, bias circuit 216, and peak detector circuit 218 in FIG. 2 correspond, respectively, to capacitors 110 and 112, voltage amplifier 114, bias circuit 116, and peak detector circuit 118 in FIG. 1. RF IN 228 in FIG. 2 also corresponds to RF IN 128 in FIG. 1. Bias circuit 216 comprises transistor 220 and resistors 222 and 224, voltage amplifier 214 comprises transistor 226 and resistor 230, and peak detector circuit 218 comprises diodes 232 and 234, resistors 236, 238, and 240, and capacitors 242 and 244.

As shown in FIG. 2, RF IN 228 is coupled to a first terminal of capacitor 210 and a second terminal of capacitor 210 is coupled to the base of transistor 226, i.e. the input of voltage amplifier 214, and a first end of resistor 222 at node 246. By way of example, the value of resistor 222 might be 500.0 ohms. Also shown in FIG. 2, the base and the collector of transistor 220 are coupled to the second end of resistor 222 and the first end of resistor 224 at node 248, and the emitter of transistor 220 is coupled to ground 250. Transistor 220 is configured to appropriately control the bias voltage applied to base of transistor 226 at node 246 such that transistor 226 can be operated as a Class AB amplifier and can be an NPN GaAs heterojunction bipolar transistor ("HBT"). In other embodiments, transistor 220 can be an NPN SiGe bipolar transistor, a FET, or other appropriate type of bipolar transistor.

Further shown in FIG. 2, a second end of resistor 224 is coupled to reference voltage ("Vref") 252, which can be an appropriate DC voltage source having no AC component. By way of example, the value of resistor 224 might be 1.0 kilo-ohm ("kOhm"). Also shown in FIG. 2, the collector of transistor 226, i.e. the output of voltage amplifier 214, is coupled to first terminals of capacitor 212 and resistor 230 at node 254 and the emitter of transistor 226 is coupled to ground 250. Transistor 226 is configured to operate as a voltage amplifier and can be an NPN GaAs HBT. In other embodiments, transistor 220 can be an NPN SiGe bipolar transistor, a FET, or other appropriate type of bipolar transistor.

Further shown in FIG. 2, a second terminal of resistor 230 is coupled to bias voltage ("Vbias") 256, which can be an appropriate DC bias voltage source having no AC component. By way of example, the value of resistor 230 might be 1.0 kOhm. Also shown in FIG. 2, a second terminal of capacitor 212 is coupled to a first terminal of resistor 236 and the anode of diode 232 at node 258, i.e. the input of peak detector circuit 218, and a second terminal of resistor 236 is coupled to Vref 252. Diode 232 is configured to operate as a peak detector and can be an appropriate type of diode as known in the art. Capacitor 212 couples the output of voltage amplifier 214 to the input of peak detector circuit 218 and might have a value of 1.0 pF, for example. By way of example, a value of resistor 236 might be 3.0 kOhm.

Further shown in FIG. 2, the cathode of diode 232 is coupled to the first terminals of resistor 238 and capacitors 242 and 244 at node 260 and the second terminals of capacitors 242 and 244 are coupled to ground 250 at node 245. Capacitor 242 filters out the RF fundamental signal in the detected signal at the cathode of diode 232, while capacitor 244 filters out the modulation signal, such as a CDMA modulation signal, in the detected signal. By way of example, the value of capacitor 242 might be 6.0 pF and the value of capacitor 244 might be approximately 1000.0 pF. Due to its large size, capacitor 244 is situated external to the semiconductor die that houses the other components in control circuit 204.

Also shown in FIG. 2, a second terminal of resistor 238 is coupled to the anode of diode 234 and DC output 262 of control circuit 204 at node 264, which is also the output of peak detector circuit 218. By way of example, the value of resistor 238 might be 5.5 kOhm. The cathode of diode 234 is coupled to a first terminal of resistor 240 and a second terminal of resistor 240 is coupled to ground 250. By way of example, the value of resistor 240 might be 8.5 kOhm. Diode 234 is configured to operate as a shunt diode and can be substantially similar to diode 232 in type and size. Diodes 232 and 234 each have a parasitic resistance that increases as temperature increases. However, diodes 232 and 234 are coupled in a voltage divider configuration such that the parasitic resistance of diode 232 cancels out the parasitic resistance of diode 234 at node 264. As a result, a DC voltage at node 264, which is outputted at DC output 262, has a minimal voltage variation between −20.0° C. and 85.0° C. By way of example, the DC voltage outputted at node 264 might vary by only approximately 0.045 volt between −20.0° C. and 85.0° C.

The function and operation of control circuit 204 will now be discussed. RF IN 228, i.e. the RF input signal coupled to the RF input of power amplifier 108 in FIG. 1, is coupled to the base of transistor 226, i.e. the input of voltage amplifier 214, via capacitor 210, which reduces the amplitude of RF IN 228 to a low level. Bias circuit 216 provides an appropriate bias voltage at node 246, i.e. the base of transistor 226, to cause transistor 226 to operate as a Class AB amplifier, for example. As a result, the output voltage at the collector of transistor 226, i.e. the output of voltage amplifier 214, is limited at the voltage peaks, which decreases the rate at which the peak voltage ramps up. As a result, the voltage peaks at the output of voltage amplifier 214 varies in a way that is substantially logarithmic function of input voltage peaks, i.e. the amplitude of RF IN 228.

The output of voltage amplifier 214 at node 254, i.e. the collector of transistor 226, is coupled to the input of peak detector circuit 218 and converted by a diode 232, i.e. a peak detector, and capacitors 242 and 244 into a DC voltage at node 264. The resulting DC voltage at node 264 varies in a way that is substantially logarithmic with respect to the amplitude of RF IN 228, which was inputted into voltage amplifier 214. Peak detector circuit 218 also utilizes a voltage divider network comprising resistors 236, 238, and 240 to shift the range of the DC voltage at node 264, i.e. the output of peak detector circuit 218, to a voltage range required by analog control bias circuit 106 in FIG. 1, which is configured to operate in a linear mode. Diode 234 is utilized in combination with diode 232 to minimize voltage variations of the DC voltage at node 264 with respect to temperature variations.

The DC voltage at node 264 is coupled to DC Output 262, i.e. the output of control circuit 204, and inputted into analog control bias circuit 106. As discussed above, analog control bias circuit 106, which comprises first stage bias circuit 120 and second stage bias circuit 122, is configured to provide a bias voltage or current to power amplifier 108 such that power amplifier 108 has a quiescent current that varies linearly with respect to a DC voltage at the input of analog control bias circuit 106. Thus, since the DC voltage at node 264 is coupled to the input of analog control bias circuit 106, power amplifier 108 has a quiescent current that varies linearly with respect to the DC voltage at node 264. However, since the DC voltage at node 264 varies in a way that is substantially logarithmic with respect to the amplitude of RF IN 228, the DC voltage at node 264 varies, i.e. increases and decreases, substantially logarithmically with respect to RF input power (in milliwatts) at the RF input of power amplifier 108. Thus, the DC voltage at node 264, which is outputted at DC output 262 of control circuit 204, causes the quiescent current of power amplifier 108 to increase and decrease in a way that is substantially logarithmic with respect to RF input power (in milliwatts) or substantially linearly with respect to RF input power (in dBm) at the RF input of power amplifier 108.

By utilizing a quiescent current control circuit to sample an RF input signal at the RF input of a power amplifier and output a DC voltage that increases and decreases in a way that is substantially linear with respect to RF input power (in dBm), the present invention advantageously provides a substantially optimal quiescent current to the power amplifier over a linear output range of the power amplifier. Thus, the present invention causes the power amplifier to have a quiescent current that automatically and linearly tracks RF input power (in dBm) from lower to higher quiescent current corresponding to lower and higher RF input power (in dBm).

Also, causing a power amplifier to have a quiescent current that is a substantially linear function of RF input power (in dBm), the present invention advantageously achieves a reduction in quiescent current at low output power levels, which advantageously results in a corresponding reduction in power consumption. Additionally, since the present invention controls the quiescent current in each stage of the power amplifier, the present invention advantageously achieves a reduction in power consumption in each stage of the power amplifier.

Additionally, the present invention's quiescent current control circuit, with the exception of one external component, can be advantageously fabricated on a single semiconductor die. Furthermore, the present invention's quiescent current control circuit can be advantageously fabricated on a single semiconductor die using GaAs technology.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Other embodiments of the present invention would include different types of analog bias circuits (using different types of differential amplifiers, FETs, etc). Also, the voltage amplifier can be manipulated to work in, for example, Class C or Class D as long as its voltage peaks are being limited and the output of the peak detector is substantially logarithmic with respect to the RF input voltage. Also other types of buffer circuits such as an operational amplifier can be placed in between the voltage amplifier and the peak-detector.

Other types of circuits can replace the voltage amplifier so long as they operate in a manner where they amplify the RF input voltage and perform a logarithmic or other manipulation of signals.

Other embodiments of the invention may also include various peak detector circuits that detect the voltage signal peak and covert the peak into a DC voltage.

Thus, quiescent current control circuit for power amplifiers has been described.

The invention claimed is:

1. A control circuit comprising:
   a voltage amplifier, said voltage amplifier configured to receive and amplify an RF signal at an RF input;
   a peak detector circuit coupled to an output of said voltage amplifier, said peak detector circuit outputting a DC voltage for causing a power amplifier to have a quiescent current that varies with respect to RF input power, wherein said peak detector circuit comprises a first diode having an anode coupled to an output of said voltage amplifier and a cathode coupled to a node, said node outputting said DC voltage.

2. The control circuit of claim 1 wherein said DC voltage causes said quiescent current to vary substantially linearly with respect to said RF input power.

3. The control circuit of claim 1 wherein said peak detector circuit comprises a second diode having an anode coupled to said node and a cathode coupled to ground.

4. The control circuit of claim 3 wherein said first diode has a first parasitic resistance and said second diode has a second parasitic resistance, wherein said first parasitic resistance cancels out said second parasitic resistance.

5. The control circuit of claim 1 wherein said voltage amplifier comprises a GaAs HBT.

6. The control circuit of claim 1 wherein an increase in amplitude of said RF signal causes a substantially linear increase in said DC voltage.

* * * * *